United States Patent
Yu et al.

(10) Patent No.: US 10,619,048 B2
(45) Date of Patent: Apr. 14, 2020

(54) COMPOSITION FOR ORGANIC ELECTRONIC ELEMENT ENCAPSULANT, AND ENCAPSULANT FORMED BY USING SAME

(71) Applicant: Momentive Performance Materials Korea Co., Ltd., Seoul (KR)

(72) Inventors: Sun Yu, Seoul (KR); Hyun-Sang Choi, Seoul (KR); Nan Soo Kim, Seoul (KR)

(73) Assignee: Momentive Performance Materials Korea Co., Ltd., Seoul (KR)

( * ) Notice: Subject to any disclaimer, the term of this patent is extended or adjusted under 35 U.S.C. 154(b) by 0 days.

(21) Appl. No.: 16/165,710

(22) Filed: Oct. 19, 2018

(65) Prior Publication Data
US 2019/0048119 A1 Feb. 14, 2019

Related U.S. Application Data

(63) Continuation of application No. PCT/KR2017/004860, filed on May 11, 2017.

(30) Foreign Application Priority Data

May 11, 2016 (KR) ........................ 10-2016-0057671

(51) Int. Cl.
| | | |
|---|---|---|
| C08F 2/46 | (2006.01) | |
| C08F 2/50 | (2006.01) | |
| C08G 61/04 | (2006.01) | |
| C08L 83/06 | (2006.01) | |
| C08K 3/013 | (2018.01) | |
| C08L 83/04 | (2006.01) | |
| C08K 3/22 | (2006.01) | |
| C08K 3/36 | (2006.01) | |
| C08F 299/08 | (2006.01) | |
| C08G 77/442 | (2006.01) | |
| H01L 51/00 | (2006.01) | |
| H01L 51/52 | (2006.01) | |
| C08K 3/08 | (2006.01) | |
| C08G 77/20 | (2006.01) | |

(52) U.S. Cl.
CPC ............ C08L 83/06 (2013.01); C08F 299/08 (2013.01); C08G 77/442 (2013.01); C08K 3/013 (2018.01); C08K 3/22 (2013.01); C08K 3/36 (2013.01); C08L 83/04 (2013.01); H01L 51/0094 (2013.01); H01L 51/5259 (2013.01); C08G 77/20 (2013.01); C08K 3/08 (2013.01); C08K 2003/2206 (2013.01); H01L 51/004 (2013.01); H01L 51/5253 (2013.01)

(58) Field of Classification Search
CPC ...... C08F 290/068; C08F 2/50; C08F 290/06; H01L 51/004; H01L 51/5253; H01L 51/0094; H01L 51/5259; H01L 51/52; C08G 77/442; C08L 83/04; C08L 83/10; C08L 83/06
USPC ........... 522/39, 33, 6, 189, 184, 1, 71; 520/1
See application file for complete search history.

(56) References Cited

U.S. PATENT DOCUMENTS

| | | | |
|---|---|---|---|
| 2004/0191566 A1 | 9/2004 | Kikuchi et al. | |
| 2014/0309380 A1* | 10/2014 | Liu | C08G 77/38 525/474 |
| 2015/0357570 A1* | 12/2015 | Lee | C09J 133/06 257/40 |
| 2016/0118620 A1 | 4/2016 | Yoo et al. | |
| 2016/0155987 A1 | 6/2016 | Yoo et al. | |
| 2017/0352836 A1* | 12/2017 | Yu | C08K 3/22 |

FOREIGN PATENT DOCUMENTS

| | | |
|---|---|---|
| JP | 2004-265776 A | 9/2004 |
| JP | 2008-210845 A | 9/2008 |
| JP | 2014-001341 A | 1/2014 |
| JP | 2014-218582 A | 11/2014 |
| JP | 2015-121690 A | 7/2015 |
| KR | 10-2012-0001148 A | 1/2012 |
| KR | 10-1589372 B1 | 1/2016 |
| WO | 2014/204257 A2 | 12/2014 |
| WO | 2017-048890 A1 | 3/2017 |

OTHER PUBLICATIONS

International Search Report for International Patent Application No. PCT/KR2017/004860, dated Aug. 21, 2017, 2 pages.
Extended European Search Report, European Application No. 17796387.3, dated Dec. 3, 2019, 7 pages.

* cited by examiner

*Primary Examiner* — Jessica Whiteley
(74) *Attorney, Agent, or Firm* — Nelson Mullins Riley & Scarborough LLP; Kongsik Kim, Esq.

(57) ABSTRACT

A composition for an encapsulant according to one embodiment of the present application comprises 1) a silicone resin, 2) one or more types of moisture absorbent, 3) one or more types of photoinitiator, 4) one or more types of fillers, and 5) a reactive silicone oligomer.

10 Claims, No Drawings

COMPOSITION FOR ORGANIC ELECTRONIC ELEMENT ENCAPSULANT, AND ENCAPSULANT FORMED BY USING SAME

CROSS-REFERENCE TO RELATED APPLICATIONS

This application is a continuation application of International Application No. PCT/KR2017/004860 filed on May 11, 2017, which claims priority to Korean Patent Application No. 10-2016-0057671 filed on May 11, 2016. The applications are incorporated herein by reference.

TECHNICAL FIELD

The present application relates to a composition for an organic electronic device encapsulant and an encapsulant formed by using the same.

BACKGROUND ART

In general, organic electronic devices are devices characterized in that a phenomenon such as light emission or a flow of electricity occurs when charges are injected into an organic layer provided between a positive electrode and a negative electrode, and it is possible to manufacture a device which serves various functions according to the organic material selected.

As a representative example, organic light emitting diodes (OLEDs) have drawn attention as a next generation flat panel display due to thin thickness and lightweight and excellent color impression, and may be manufactured on a glass substrate, an inorganic material substrate comprising silicon, a metal substrate, and a flexible substrate such as a plastic substrate or a metal foil in the related art. These organic electronic devices are very vulnerable to moisture and oxygen and thus have a disadvantage in that light emitting efficiency and a service life are significantly reduced when the devices are exposed to the air or when moisture is introduced into the inside of a panel from the outside.

In order to solve the aforementioned problem, attempts have been made to block moisture and oxygen introduced from the outside by using an encapsulant film using a glass cap or a metal cap or a laminating method or depositing inorganic materials. Further, there are methods for implementing adhesive properties and encapsulation properties by applying a curable film or a curable material on a surface of an organic layer or a metal layer, and then performing a curing process.

However, the glass cap has a problem in implementing a large area due to mechanical damage and the like, and the metal cap has a problem in processes due to a difference in thermal expansion coefficients with a substrate. Further, an adhesive film using the laminating method has problems such as introduction of moisture and oxygen through an interface of the adhesive surface of the film, and the existing processes in which organic materials are deposited under vacuum and inorganic materials are sputtered under vacuum have problems in that productivity is low because inorganic materials need to be deposited in multilayers by a sputtering system under vacuum in order to prevent the introduction of water and oxygen through an interface on the top of the sputtering, and productivity deteriorates and mass production is unavailable because organic materials and inorganic materials need to be formed in multilayers under vacuum.

In addition, a liquid encapsulation method has a disadvantage in that byproducts produced during the curing process or unreacted residue and the like in a curing initiator remain inside a hermetically sealed structure and thus interrupt the driving of an organic electronic device or shorten a service life of the organic electronic device, and the like.

Furthermore, when using a metal cap method in which a moisture absorbent is provided inside a panel during the encapsulation of the organic electronic device, an extension portion which protrudes at a predetermined height is formed in a metal cap structure for using a moisture absorbent, and when the metal cap is lastly bonded to a substrate using an adhesive, or an organic light emitting device is encapsulated by processing glass to form a glass cap, a method of bonding the metal cap to the substrate by using a method such as sand blast or etching to provide a moisture absorbent inside a predetermined groove is used. The method in the related art makes it difficult to process the metal cap due to an expansion of a space inside the encapsulation when a panel becomes large, and may cause a problem in that the glass cap is easily broken by external pressure.

SUMMARY

The present application has been made in an effort to provide a composition capable of preparing an encapsulant which may improve a service life of an organic electronic device and effectively block oxygen or moisture, and the like, which are introduced from the outside, and an encapsulant using the same.

An exemplary embodiment of the present application provides a composition for an encapsulant, comprising:
1) a silicone resin;
2) one or more moisture absorbents;
3) one or more photoinitiators;
4) one or more fillers; and
5) a reactive silicone oligomer.

Further, another exemplary embodiment of the present application provides an encapsulant using the composition for an encapsulant.

Further, still another exemplary embodiment of the present application provides an organic electronic device comprising the encapsulant.

The composition for an encapsulant according to an exemplary embodiment of the present application is characterized in that it is possible to manufacture an encapsulant which may improve a service life of an organic electronic device, and effectively block oxygen and moisture and the like, which are introduced from the outside. Further, a general composition applied as the encapsulant in the related art has a disadvantage in that the composition is bonded to an organic electronic device and then mixed with other materials, thereby losing the characteristics, or a gap between bonded surfaces is not maintained due to uneven pressure applied during the bonding. However, the composition for an encapsulant according to an exemplary embodiment of the present application has characteristics in that the gap may be maintained well after the composition is bonded to an organic electronic device because a material cured by using a curable composition has strength, and thus the gap is not easily changed even though pressure is applied.

DETAILED DESCRIPTION

Hereinafter, the present application will be described in detail.

Organic EL devices are polycrystalline semiconductor devices, and are used for a liquid crystal backlight, and the like in order to obtain light emission with high brightness at low voltage, and expected as a thin-type flat display device. However, there are problems in that organic EL devices are extremely vulnerable to moisture, an interface between a metal electric field and an organic EL layer may be peeled off due to the effects of moisture, the resistance may be increased due to the oxidation of metal, and organic materials may change in quality by moisture, and as a result, the organic EL devices do not emit light, and brightness may deteriorate.

In order to solve the problems, methods for encapsulating an organic EL device with a curable composition have been developed. As the existing encapsulation methods, a method for molding an organic EL device with an acrylic resin, a method for blocking an organic EL device from moisture by adding a moisture absorbent into an encapsulant resin of the organic EL device, and the like have been proposed.

Among them, a method for mixing an encapsulant resin with a moisture absorbent and using the mixture has been most widely used, but encapsulants which are not a curable type have a disadvantage in that a production yield becomes low because it is difficult to withstand a process limitation point at a high temperature and high pressure when a post-process is performed.

The present application has been made in an effort to provide a curable encapsulant composition, which may prepare an encapsulant capable of improving a service life of an organic electronic device and effectively blocking oxygen and moisture, and the like, which are introduced from the outside, and may have process stability when a post-process is performed by introducing a curable system, and an encapsulant using the same.

A composition for an encapsulant according to an exemplary embodiment of the present application comprises: 1) a silicone resin; 2) one or more moisture absorbents; 3) one or more photoinitiators; 4) one or more fillers; and 5) a reactive silicone oligomer.

In the composition for an encapsulant according to an exemplary embodiment of the present application, specific examples of the silicone resin comprise organopolysilicone-based resins, and the like, but are not limited thereto. Further, examples of the organopolysilicone-based resins will be described below in more detail.

In the organopolysilicone-based resin, one or more functional groups selected from the group consisting of an alkyl group, an aryl group, and an alkenyl group may be bonded to a silicone main chain.

Specific examples of the alkyl group comprise a methyl group, an ethyl group, a propyl group, a 1-methylethyl group, a butyl group, a 1-methylpropyl group, a 2-methylpropyl group, a 1,1-dimethylethyl group, a pentyl group, a 1-methylbutyl group, a 1-ethylpropyl group, a 2-methylbutyl group, a 3-methylbutyl group, a 1,2-dimethylpropyl group, a 2,2-dimethylpropyl group, a hexyl group, a heptyl group, an octyl group, a nonyl group, a decyl group, a cycloalkyl group, and the like, but are not limited thereto.

Specific examples of the aryl group comprise: a phenyl group; a naphthyl group; an alkylaryl group such as a tolyl group and a xylyl group; an arylalkyl group such a benzyl group and a phenethyl group, and the like, but are not limited thereto.

The alkenyl group typically has 2 to 10 carbon atoms, and specific examples thereof comprise a vinyl group, an allyl group, a methacrylic group, a methyl methacrylic group, an acrylic group, and the like, but are not limited thereto.

The organopolysilicone-based resin is preferably one or more selected from compounds represented by the following Chemical Formula 1.

[Chemical Formula 1]

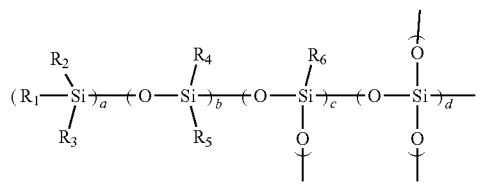

In Chemical Formula 1, $R_1$ to $R_6$ are the same as or different from each other, and may be each independently selected from the group consisting of hydrogen, an alkyl group, an alkenyl group, an aryl group, a glycidyl group, an isocyanate group, a hydroxy group, a carboxyl group, a vinyl group, an acrylate group, a methacrylate group, an epoxide group, a cyclic ether group, a sulfide group, an acetal group, a lactone group, an amide group, an alkylaryl group, an alkylglycidyl group, an alkylisocyanate group, an alkylhydroxy group, an alkylcarboxyl group, an alkylvinyl group, an alkylacrylate group, an alkylmethacrylate group, an alkyl cyclic ether group, an alkylsulfide group, an alkylacetal group, an alkyl lactone group, and an alkyl amide group, and a, b, c, and d are each independently a real number from 0 to 1, and (a+b+c+d) is 1.

The organopolysilicone-based resin may have a weight average molecular weight of 100 to 1,000,000 or 1,000 to 50,000, but the weight average molecular weight is not limited thereto.

The content of the silicone resin may be 1 to 80 wt % based on the total weight of the composition for an encapsulant, but is not limited thereto. When the content of the silicone resin is within 1 to 80 wt %, it is possible to mix an amount of a moisture absorbent capable of maintaining a sufficient hygroscopic performance while maintaining excellent miscibility with the moisture absorbent. When the content of the silicone resin is less than 1 wt %, it is impossible to mix the moisture absorbent, and when the content is more than 80 wt %, it is impossible to mix a moisture absorbent capable of obtaining the hygroscopic performance sufficient to protect the device.

In the composition for an encapsulant according to an exemplary embodiment of the present application, the moisture absorbent may impart hygroscopic properties to the composition for an encapsulant, and may serve to adjust thixotropy. Specific examples of the moisture absorbent comprise one or a mixture of two or more selected from a metal powder such as alumina, a metal oxide, an organic metal oxide, a metal salt, or phosphorus pentoxide ($P_2O_5$), but are not limited thereto.

Specific examples of the metal oxide comprise lithium oxide ($Li_2O$), sodium oxide ($Na_2O$), barium oxide (BaO), calcium oxide (CaO), magnesium oxide (MgO), and the like, examples of the metal salt comprise: sulfuric acid salts such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) or nickel sulfate ($NiSO_4$); metal halides such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride (TaF$_5$), niobium fluoride (NbF$_5$), lithium bromide (LiBr), calcium bromide (CaBr$_2$), cesium bromide (CeBr$_3$), selenium bromide (SeBr$_4$), vanadium bromide (VBr$_3$), magnesium bromide (MgBr$_2$), barium iodide (BaI$_2$) or magnesium iodide (MgI$_2$); or metal chlorates such as barium perchlorate (Ba(ClO$_4$)$_2$) or magnesium perchlorate (Mg(ClO4)$_2$), but the examples are not limited thereto.

The metal oxides may be blended with a composition in a state where the moisture absorbent is approximately processed. For example, the encapsulant may be a thin film having a thickness of 30 μm or less according to the kind of organic electronic device to which the encapsulant is applied, and in this case, a process of pulverizing the moisture absorbent may be required. In the pulverization of the moisture absorbent, a process such as a 3-roll mill, a bead mill, or a ball mill may be used.

The content of the moisture absorbent may be 10 to 90 wt % based on the total weight of the composition for an encapsulant, but is not limited thereto. When the content of the moisture absorbent is less than 10 wt % based on the total weight of the composition for an encapsulant, it is difficult to obtain a hygroscopic performance sufficient to protect a device, and when the content exceeds 90 wt %, viscosity is extremely increased so that the moisture absorbent may not be applied to the process.

In the composition for an encapsulant according to an exemplary embodiment of the present application, the photoinitiator is thermally inert, but generates free radicals when exposed to chemical rays. Examples of the photoinitiator comprise a substituted or unsubstituted polynuclear quinone, which is a compound having two intra-cyclic carbon atoms among the conjugated carbon cyclic compounds, for example, 2-benzyl-2-(dimethylamino)-1-(4-morpholino phenyl)-1-butanone, 2,2-dimethoxy-2-phenylacetophenone, 9,10-anthraquinone, 2-methylanthraquinone, 2-ethylanthraquinone, 2-tert-butylanthraquinone, octamethylanthraquinone, 1,4-naphthoquinone, 9,10-phenanthrenequinone, benz (benza)anthracene-7,12-dione, 2,3-naphthacene-5,12-dione, 2-methyl-1,4-naphthoquinone, 1,4-dimethyl anthraquinone, 2,3-dimethyl anthraquinone, 2-phenyl anthraquinone, 2,3-diphenyl anthraquinone, retenquinone, 7,8,9,10-tetrahydronaphthacene-5,12-dione, and 1,2,3,4-tetrahydrobenz(tetrahydrobenza)-anthracene-7,12-dione, but are not limited thereto.

The content of the photoinitiator may be 0.1 to 10 wt % based on the total weight of the composition for an encapsulant, but is not limited thereto. When the content of the photoinitiator is less than 0.1 wt % based on the total weight of the composition for an encapsulant, there may occur a problem in that even though strong ultraviolet rays are irradiated thereon, curing does not proceed due to a small number of active radicals which promotes the curing, and when the content exceeds 10 wt %, there is concern in that the service life of the organic light emitting device may be shortened because outgassing occurs under the temperature conditions of less than 100° C. after the curing.

The composition for an encapsulant according to an exemplary embodiment of the present application may comprise one or more fillers. The filler may lengthen a moving route of moisture or humidity, which permeates into an encapsulation structure, to suppress the permeation, and may maximize a property of blocking moisture and humidity through interaction with a matrix structure of the resin and a moisture absorbent, and the like. In an exemplary embodiment of the present application, as the above-described filler, it is possible to use one or a mixture of two or more selected from clay, talc, silica, barium sulfate, aluminum hydroxide, calcium carbonate, magnesium carbonate, zeolite, zirconia, titania and montmorillonite, but the examples are not limited thereto.

Further, in order to increase bonding efficiency of the filler and the resin, a product of which the surface is treated with an organic material may be used as the filler, or the filler may be used by additionally adding a coupling agent thereto.

The content of the filler may be more than 0 wt % and 20 wt % or less based on the total weight of the composition for an encapsulant, but is not limited thereto. When the content of the filler exceeds 20 wt % based on the total weight of the composition for an encapsulant, the thixotropy is extremely increased similarly to the case where 95 wt % or more of the moisture absorbent is mixed, so that the filler has a viscosity which is difficult to be applied to the process.

The reactive silicone oligomer is preferably one or more selected from compounds represented by the following Chemical Formula 2, and may increase the miscibility and physical attraction force between the resin and the filler through physical interaction with the filler. Examples of the reactive silicone oligomer comprise a silicone oligomer in which acrylate is introduced into the end thereof, a silicone oligomer in which methacrylate is introduced into the end thereof, a silicone oligomer in which an epoxy group is introduced into the end thereof, a silicone oligomer into which an urethane group is introduced, a silicone oligomer into which an isocyanate group is introduced, and the like.

[Chemical Formula 2]

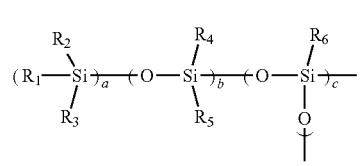

In Chemical Formula 2,

R$_1$ to R$_6$ are the same as or different from each other, and may be each independently selected from the group consisting of hydrogen, an alkyl group, an alkenyl group, an aryl group, a glycidyl group, an isocyanate group, a hydroxy group, a carboxyl group, a vinyl group, an acrylate group, a methacrylate group, an epoxide group, a cyclic ether group, a sulfide group, an acetal group, a lactone group, an amide group, an alkylaryl group, an alkylglycidyl group, an alkylisocyanate group, an alkylhydroxy group, an alkylcarboxyl group, an alkylvinyl group, an alkylacrylate group, an alkylmethacrylate group, an alkyl cyclic ether group, an alkylsulfide group, an alkylacetal group, an alkyl lactone group, and an alkyl amide group, and a, b, and c are each independently a real number from 0 to 1, and (a+b+c) is 1 or 2.

The content of the reactive silicone oligomer may be 1 to 40 wt % based on the total weight of the composition for an encapsulant, but is not limited thereto. When the content of the reactive silicone oligomer is 1 to 40 wt % based on the total weight of the composition for an encapsulant, it is possible to increase the miscibility and physical attraction force between the resin and the filler through physical interaction with the filler.

The composition for an encapsulant according to an exemplary embodiment of the present application may additionally comprise a monomer known in the art in order to adjust a curing speed of the silicone resin material. Specific examples of the monomer comprise an acrylate-based monomer, a methacrylate-based monomer, a siloxane-based monomer, and the like, but are not limited thereto.

Examples of the monomer comprise triethylolpropane ethoxy triacrylate, t-butyl (meth)acrylate, 1,5-pentanediol di(meth)acrylate, N,N-diethylaminoethyl (meth)acrylate, ethylene glycol di(meth)acrylate, 1,4-butanediol di(meth) acrylate, diethylene glycol di(meth)acrylate, hexamethylene glycol di(meth)acrylate, 1,3-propanediol di(meth)acrylate, decamethylene glycol di(meth)acrylate, 1,4-cyclohexanediol di(meth)acrylate, 2,2-dimethylolpropane di(meth)acrylate, glycerol di(meth)acrylate, tripropylene glycol di(meth) acrylate, glycerol tri(meth)acrylate, trimethylolpropane tri (meth)acrylate, pentaerythritol tri(meth)acrylate, polyoxyethylated trimethylolpropane tri(meth)acrylate, 2,2-di-(p-hydroxyphenyl)propane diacrylate, pentaerythritol tetra(meth)acrylate, 2,2-di-(p-hydroxyphenyl)propane dimethacrylate, triethylene glycol diacrylate, polyoxyethyl-2,2-di-(p-hydroxyphenyl)propane dimethacrylate, di-(3-methacryloxy-2-hydroxypropyl)ether of bisphenol-A, di-(2-methacryloxyethyl)ether of bisphenol-A, di-(3-acryloxy-2-hydroxypropyl)ether of bisphenol-A, di-(2-acryloxyethyl) ether of bisphenol-A, di-(3-methacryloxy-2-hydroxypropyl) ether of 1,4-butanediol, triethylene glycol dimethacrylate, polyoxypropyltrimethylol propane triacrylate, butylene glycol di(meth)acrylate, 1,2,4-butanetriol tri(meth)acrylate, 2,2,4-trimethyl-1,3-pentanediol di(meth)acrylate, 1-phenyl ethylene-1,2-dimethacrylate, diallyl fumarate, styrene, 1,4-benzenediol dimethacrylate, 1,4-diisopropenyl benzene, 1,3,5-triisopropenyl benzene, silicone-based monomers, silicone acrylate-based monomers, silicone urethane-based monomers, and the like, but are not limited thereto.

In addition, the composition for an encapsulant according to an exemplary embodiment of the present application may comprise one or more additives such as a curing catalyst, a viscosity adjusting agent, a curing agent, a dispersing agent, a stabilizer, and a curing promoter depending on the use thereof. These additives may be used either alone or in mixture of two or more thereof.

Furthermore, an encapsulant according to an exemplary embodiment of the present application is characterized by using the composition for an encapsulant. More specifically, the encapsulant according to an exemplary embodiment of the present application comprises: 1) a silicone resin; 2) one or more moisture absorbents; 3) one or more photoinitiators; 4) one or more fillers; and 5) a reactive silicone oligomer.

In the encapsulant according to an exemplary embodiment of the present application, the descriptions on the silicone resin, the moisture absorbent, the photoinitiator, the filler, the reactive silicone oligomer, and the like are the same as those described above, and thus the specific description thereof will be omitted.

The encapsulant according to an exemplary embodiment of the present application may be formed by using a method known in the art, except that the above-described composition for an encapsulant is used. More specifically, the encapsulant may be formed by using a method of applying, coating, or printing the composition for an encapsulant on a substrate, but the method is not limited thereto.

The composition for an encapsulant according to an exemplary embodiment of the present application is characterized in that it is possible to prepare an encapsulant which may improve a service life of an organic electronic device, and effectively block oxygen and moisture and the like, which are introduced from the outside. Further, a general getter applied as the encapsulant in the related art has a disadvantage in that the getter is bonded to an organic electronic device and then mixed with other materials, thereby losing the characteristics, or a gap between bonded surfaces is not maintained due to uneven pressure applied during the bonding. However, the composition for an encapsulant according to an exemplary embodiment of the present application has characteristics in that the gap may be maintained well after the composition is bonded to an organic electronic device because a material cured by using a curable composition has strength, and thus the gap is not easily changed even though pressure is applied.

The encapsulant according to an exemplary embodiment of the present application may be applied to those which encapsulate and protect various objects. In particular, the encapsulant may be effective for protecting an object comprising a device which is sensitive to external factors, for example, moisture and humidity. Examples of the object to which the encapsulant may be applied comprise: a photovoltaic device, a rectifier, a transmitter, or an organic electronic device such as an organic light emitting diode (OLED); a solar cell; or a secondary battery, and the like, but are not limited thereto.

The encapsulant may efficiently fix and support an upper substrate and a lower substrate while exhibiting excellent moisture blocking characteristics and optical characteristics in an organic electronic device. In addition, since the encapsulant exhibits excellent transparency by preparing a moisture absorbent in a nano-unit size and uniformly dispersing the moisture absorbent in the composition for an encapsulant, the encapsulant may be formed as a stable encapsulant regardless of the type of organic electronic device such as top emission or bottom emission.

The organic electronic device may be provided with a typical configuration known in the art, except that an encapsulant is formed of the above-described materials. For example, it is possible to use glass, metal or a polymer film, and the like, which are typically used in the art, as the lower or upper substrate. Furthermore, the organic electronic device may comprise, for example, a pair of electrodes and a layer of an organic material formed between the pair of electrodes. Here, one of the pair of electrodes may be formed of a transparent electrode. Further, the layer of the organic material may comprise, for example, a hole transporting layer, a light emitting layer, an electron transporting layer, and the like. Hereinafter, the present specification will be described in more detail through Examples. However, the following Examples are provided only for exemplifying the present specification, but are not intended to limit the present specification.

EXAMPLES

Example 1

39 g of a silicone resin (1) (methacrylate polydimethylsiloxane, Aldrich), 45 g of a moisture absorbent (CaO, Yoshizawa Lime Industry Co., Ltd.), 4 g of a photoinitiator (Irgacure 369) of BASF SE, 2 g of inorganic silica particle (HM-305, Tokuyama Corp.), and 10 g of a silicone dimer (TSL-9706) were primarily mixed by using a paste mixer. The mixed composition was put into a 3-roll mill, and a milling process was performed three times to prepare a binder composition for a getter. A 160 cc syringe was charged with the mixture, and then bubbles were sufficiently removed using a centrifuge, and the resulting mixture was stored in a glove box at room temperature under an anhydrous nitrogen atmosphere.

Example 2

A composition was prepared by using the same method as in Example 1, except that in Example 1, the silicone resin (1) was changed into 29 g of methacrylate polydimethylsiloxane (Aldrich) and 10 g of vinyl polyvinyldimethylsiloxane (Aldrich) was added as the silicone resin (2).

methacrylate polydimethylsiloxane (Aldrich) and 10 g of vinyl polyvinyldimethylsiloxane (Aldrich) was added as the silicone resin (2).

Comparative Example 3

A composition was prepared by using the same method as in Example 1, except that in Example 1, the weight of the silicone resin (1) was changed into 1 g and the weight of the silicone oligomer was changed into 50 g without using the inorganic silica particles.

Comparative Example 4

A composition was prepared by using the same method as in Example 1, except that in Example 1, the weight of the silicone resin (1) was changed into 1 g and the weight of the inorganic silica particles was changed into 50 g without using the silicone oligomer.

TABLE 1

| Component | Material | Content (wt %) | | | | | |
|---|---|---|---|---|---|---|---|
| | | Example 1 | Example 2 | Comparative Example 1 | Comparative Example 2 | Comparative Example 3 | Comparative Example 4 |
| Polymer resin | Silicone resin (1) | 39 | 29 | 51 | 41 | 1 | 1 |
| | Silicone resin (2) | 0 | 10 | 0 | 10 | 0 | 0 |
| | Acrylic resin | 0 | 0 | 0 | 0 | 0 | 0 |
| Filler | HM-30S | 2 | 2 | 0 | 0 | 0 | 50 |
| Silicone oligomer | TSL-9706 | 10 | 10 | 0 | 0 | 50 | 0 |
| Photoinitiator | Irgacure 369 | 4 | 4 | 4 | 4 | 4 | 4 |
| Moisture absorbent | Calcium oxide | 45 | 45 | 45 | 45 | 45 | 45 |

Comparative Example 1

A composition was prepared by using 51 g of the silicone resin (1) (methacrylate polydimethylsiloxane, Aldrich), 45 g of a moisture absorbent (CaO, Yoshizawa Lime Industry Co., Ltd.), and 4 g of a photoinitiator (Irgacure 369) of BASF SE in the same manner as in Example 1.

Comparative Example 2

A composition was prepared by using the same method as in Comparative Example 1, except that in Comparative Example 1, the silicone resin (1) was changed into 41 g of Characteristics of the compositions prepared in Examples 1 and 2 and Comparative Examples 1 to 4 were evaluated, and the evaluation results are shown in the following Table 2.

TABLE 2

| | Example 1 | Example 2 | Comparative Example 1 | Comparative Example 2 | Comparative Example 3 | Comparative Example 4 |
|---|---|---|---|---|---|---|
| Thixotropic index | 3.5 | 2.4 | 1.6 | 1.3 | 4 | Not blended |
| Curing energy (UV-A, mJ/cm$^2$) | <1000 | <1250 | <10000 | <15000 | <750 | — |
| Shelf life@40° C. (hr) | >2000 | >2000 | >2000 | >2000 | <250 | — |

For the thixotropic index (T.I.), the viscosity in accordance with each shear rate was analyzed by using a rheometer. The T.I. was obtained as a value obtained by dividing the viscosity values at 3 1/s and 30 1/s.

For the curing energy, an increase in viscosity was confirmed while an exposure is performed by using a photo rheometer (omni cure) to irradiate UV in the UV-A wavelength range, and an interval where an increase in viscosity according to the time did not occur was determined as the curing energy.

For the shelf life, the viscosity for each time was periodically confirmed by positioning each sample under the condition of 40° C., and then the time when an increase in viscosity exceeded 50% was confirmed.

As described in the results, the composition for an encapsulant according to an exemplary embodiment of the present application is characterized in that it is possible to prepare an encapsulant which may improve a service life of an organic electronic device, and effectively block oxygen and moisture and the like, which are introduced from the outside. Further, a general composition applied as the encapsulant in the related art has a disadvantage in that the composition is bonded to an organic electronic device and then mixed with other materials, thereby losing the characteristics, or a gap between bonded surfaces is not maintained due to uneven pressure applied during the bonding. However, the composition for an encapsulant according to an exemplary embodiment of the present application has characteristics in that the gap may be maintained well after the composition is bonded to an organic electronic device because a material cured by using a curable composition has strength, and thus the gap is not easily changed even though pressure is applied.

The invention claimed is:

1. A composition for an encapsulant, comprising:
   1) a silicone resin;
   2) one or more moisture absorbents;
   3) one or more photoinitiators;
   4) one or more fillers; and
   5) a reactive silicone oligomer,
   wherein the silicone resin comprises one or more selected from the group consisting of methacrylate polydimethylsiloxane and vinyl polyvinyldimethylsiloxane, and
   wherein the reactive silicone oligomer comprises one or more selected from the group consisting of a silicone oligomer including acrylate at an end thereof, a silicone oligomer including methacrylate at an end thereof, a silicone oligomer including an epoxy group at an end thereof, a silicone oligomer including an urethane group, and a silicone oligomer including an isocyanate group.

2. The composition of claim 1, wherein a content of the silicone resin is 1 to 80 wt % based on a total weight of the composition for an encapsulant.

3. The composition of claim 1, wherein the moisture absorbent comprises one or more selected from the group consisting of a metal powder, a metal oxide, an organic metal oxide, a metal salt and phosphorus pentoxide ($P_2O_5$).

4. The composition of claim 1, wherein a content of the moisture absorbent is 10 to 90 wt % based on the total weight of the composition for an encapsulant.

5. The composition of claim 1, wherein the filler comprises one or more selected from the group consisting of clay, talc, silica, barium sulfate, aluminum hydroxide, calcium carbonate, magnesium carbonate, zeolite, zirconia, titania, and montmorillonite.

6. The composition of claim 1, wherein a content of the filler is more than 0 and 20 wt % or less based on the total weight of the composition for an encapsulant.

7. The composition of claim 1, wherein a content of the photoinitiator is 0.1 to 10 wt % based on the total weight of the composition for an encapsulant.

8. The composition of claim 1, wherein a content of the reactive silicone oligomer is 1 to 40 wt % based on the total weight of the composition for an encapsulant.

9. An encapsulant formed by using the composition for an encapsulant according to claim 1.

10. An organic electronic device comprising the encapsulant according to claim 9.

* * * * *